(12) United States Patent
Huang

(10) Patent No.: US 11,239,393 B1
(45) Date of Patent: Feb. 1, 2022

(54) SURFACE MOUNTED LED DEVICE

(71) Applicant: POWER MOS ELECTRONICS LIMITED, Kowloon (HK)

(72) Inventor: Ping Huang, Shenzhen (CN)

(73) Assignee: POWER MOS ELECTRONICS LIMITED, Hong Kong (CN)

( * ) Notice: Subject to any disclaimer, the term of this patent is extended or adjusted under 35 U.S.C. 154(b) by 0 days.

(21) Appl. No.: 17/199,064

(22) Filed: Mar. 11, 2021

(30) Foreign Application Priority Data

Jan. 11, 2021 (CN) .......................... 202120056607.7

(51) Int. Cl.
*H01L 33/48* (2010.01)
*H01L 33/62* (2010.01)

(52) U.S. Cl.
CPC ............ *H01L 33/486* (2013.01); *H01L 33/62* (2013.01)

(58) Field of Classification Search
CPC combination set(s) only.
See application file for complete search history.

(56) References Cited

U.S. PATENT DOCUMENTS

| 2018/0261149 A1* | 9/2018 | Lin | ...................... H01L 25/0753 |
| 2019/0107271 A1* | 4/2019 | Lin | .......................... H01L 33/62 |
| 2019/0229133 A1* | 7/2019 | Li | ........................ H01L 27/1244 |

* cited by examiner

*Primary Examiner* — Ratisha Mehta
(74) *Attorney, Agent, or Firm* — Birch, Stewart, Kolasch & Birch, LLP

(57) ABSTRACT

A surface mounted Light Emitting Diode (LED) device includes a printed circuit board (PCB), at least one color LED chip mounted on the PCB, and a driving chip. The driving chip is mounted on the PCB and electrically connected to the at least one color LED chip to drive the at least one color LED chip. The driving chip has a signal input port and a signal output port. The signal input port is electrically connected to a signal input conductive pad, and the signal output port is electrically connected to a signal output conductive pad. The surface mounted LED device further includes a gap located between the signal input conductive pad and the signal output conductive pad for creating a space for a cutting apparatus to sever any conductive line through the gap, and making a manufacturing procedure of the surface mounted LED device easier.

9 Claims, 4 Drawing Sheets

US 11,239,393 B1

SURFACE MOUNTED LED DEVICE

BACKGROUND OF THE INVENTION

1. Field of the Invention

The present invention relates to a Light Emitting Diode (LED) device, and more particularly a surface mounted LED device.

2. Description of the Related Art

Surface mounted LED devices are commonly connected in series by conductive wires in an LED string light, and are controlled by a shift registered signal for color changes. The surface mounted LED devices are connected in series and each has a signal input port and a signal output port for receiving and transmitting the shift registered signal. The shift registered signal first enters one of the surface mounted LED devices through the signal input port. A driving chip of the surface mounted LED devices would process the shift registered signal, and output a processed shift registered signal from the signal output port to next one of the surface mounted LED devices connected in series. In this way, each of the surface mounted LED devices connected in series can receive the signal for emitting a color respectively.

Since the shift registered signal must be processed by the driving chip before outputted to the next one of the surface mounted LED devices, the surface mounted LED devices have to be connected in series and not in parallel. Therefore, the signal input port and the signal output port of the same surface mounted LED device cannot be connected. In other words, the surface mounted LED devices should be prevented from any parallel connections in signal transmission.

For example, to transport the shift registered signal, a power source, a ground, the signal input port, and the signal output port are needed. One of the conductive wires would connect with the power sources of two adjacent surface mounted LED devices, another one of the conductive wires would connect with the grounds of the two adjacent surface mounted LED devices, and the other one of the wires would connect with the signal input port of one of the two adjacent surface mounted LED devices and the signal output port of another one of the two adjacent surface mounted LED devices. Therefore, the two adjacent surface mounted LED devices can be connected in series.

However, the two adjacent surface mounted LED devices need three conductive wires for connecting the two adjacent surface mounted LED devices. Namely, when a number of the surface mounted LED devices included in the LED string light increases, a number of the conductive wires will increase. Furthermore, it is not easy to prepare a large number of the conductive wires, and aligning the conductive wires to each of the signal input port and the signal output port becomes an additional manufacturing challenge.

SUMMARY OF THE INVENTION

To overcome the aforementioned drawback, a surface mounted Light Emitting Diode (LED) device of the present invention provides a better design for ensuring the surface mounted LED devices in an LED string light can easily connect to each other in series.

The surface mounted LED device includes:
a printed circuit board (PCB);
at least one color LED chip, mounted on the PCB;
a driving chip, mounted on the PCB, and electrically connected to the at least one color LED chip to drive the at least one color LED chip; wherein the driving chip includes a power port, a grounding port, a signal input port, and a signal output port;
a first power conductive pad, mounted on a surface of the PCB, and electrically connected to the power port of the driving chip;
a first grounding conductive pad, mounted on the surface of the PCB, and electrically connected to the grounding port of the driving chip;
a signal input conductive pad, mounted on the surface of the PCB, and electrically connected to the signal input port of the driving chip;
a signal output conductive pad, mounted on the surface of the PCB, and electrically connected to the signal output port of the driving chip;
wherein the PCB has a gap, and the gap of the PCB is located between the signal input conductive pad and the signal output conductive pad.

The gap of the PCB is critical to the present invention, since the gap of the PCB creates a space where a cutting apparatus is able to reach and sever any possible conductive wire on which the surface mounted LED device is mounted through the gap. For manufacturing the LED string light, a user can prepare a first conductive wire connecting to all the first power conductive pads of the surface mounted LED devices in the LED string light, a second conductive wire connecting to all the first grounding conductive pads of the surface mounted LED devices in the LED string light, and a third conductive wire connecting to both the signal input conductive pad and the signal output conductive pad. Then, the user can use a cutting apparatus to serve an electric connection between the signal input conductive pad and the signal output conductive pad in the same surface mounted LED device. Namely, the gap of the PCB enables a user to sever the electric connection between the signal input conductive pad and the signal output conductive pad in the same surface mounted LED device.

Therefore, the LED string light can be easily manufactured by using the surface mounted LED devices of the present invention.

DETAILED DESCRIPTION OF THE INVENTION

A surface mounted Light Emitting Diode (LED) device of the present invention is better demonstrated with an embodiment of the present invention for showcasing how the surface mounted LED device is practically designed for allowing a cutting apparatus to operate during a manufacturing process for the surface mounted LED device.

Figure 1:
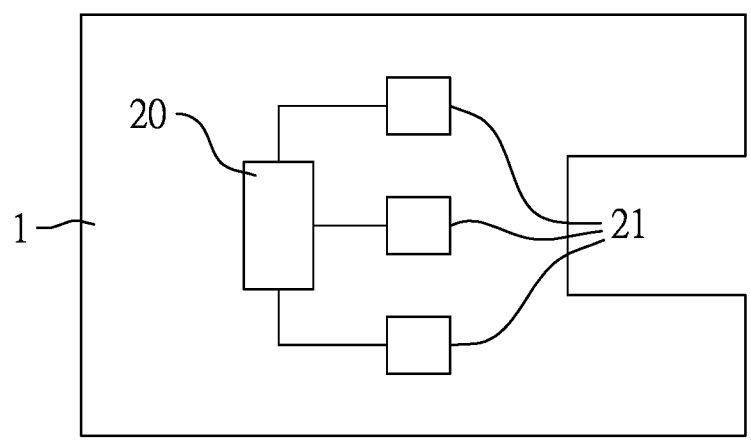
FIG. 1 is a perspective view of one surface of an embodiment of the present invention.

With reference to FIG. 1, in the embodiment of the present invention, the surface mounted LED device is mounted on a Printed Circuit Board (PCB) 1. On a surface of the PCB 1, a driving chip 20 and at least one color LED chip 21 are mounted as a light emitting unit. The driving chip 20 is electrically connected to the at least one color LED chip 21 to drive the at least one color LED chip 21. The at least one color LED chip 21 would display colors in accordance to however the driving chip 20 demands. Since most LED colors are made out of a color combination of red, green, and blue (RGB), the at least one color LED chip 21 can be a tri-color LED chip, displaying any RGB color combinations in accordance to however the driving chip 20 demands.

Figure 2:
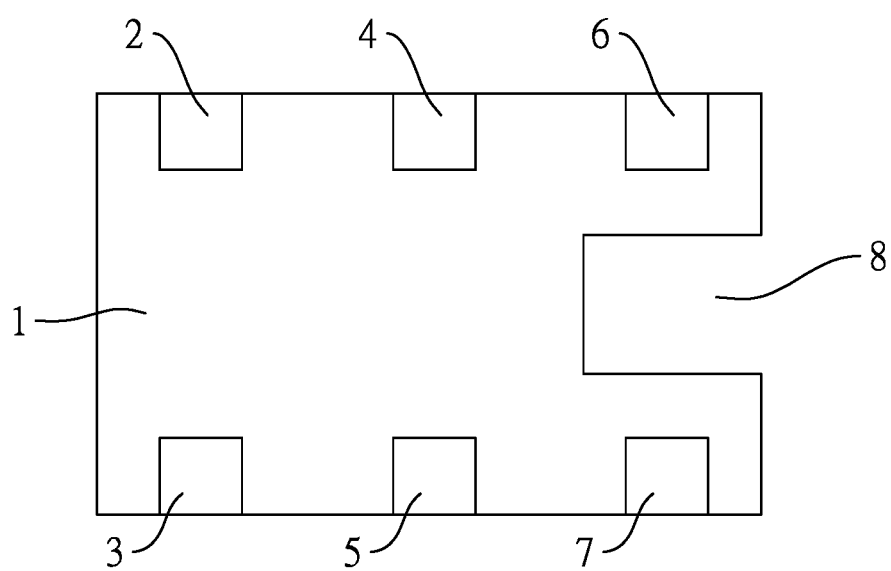
FIG. 2 is a perspective view of the other surface of the embodiment of the present invention before surface mounting on three conductive wires.

With reference to FIG. 2, in the embodiment of the present invention, on the other surface of the PCB 1, a first power conductive pad 2, a first grounding conductive pad 4, and a signal input conductive pad 6 are mounted on the PCB 1. Furthermore, a second power conductive pad 3 is also mounted on the PCB 1, aligning with the first power conductive pad 2, a second grounding conductive pad 5 is also mounted on the PCB 1, aligning with the first grounding conductive pad 4, and a signal output conductive pad 7 is also mounted on the PCB 1, aligning with the signal input conductive pad 6. A gap 8 is formed on the PCB 1 between the signal input conductive pad 6 and the signal output conductive pad 7. In the embodiment of the present invention, the gap 8 is located on an edge of the PCB 1 and is rectangular shaped.

The driving chip 21 has a power port, a grounding port, a signal input port, and a signal output port. The first power conductive pad 2 and the second power conductive pad 3 are electrically connected to the driving chip 21 through the power port. The first grounding conductive pad 4 and the second grounding conductive pad 5 are electrically connected to the driving chip 21 through the grounding port. The signal input conductive pad 6 is electrically connected to the driving chip 21 through the signal input port, and the signal output conductive pad 7 is electrically connected to the driving chip 21 through the signal output port.

Without the gap 8 on the PCB 1, the surface mounted LED device resembles an ordinary surface mounted LED device. The gap 8 is therefore critically important for the surface mounted LED device of the present invention, because without the gap 8, the surface mounted LED device would have trouble transporting a shift registered signal in an LED string light.

Figure 3:
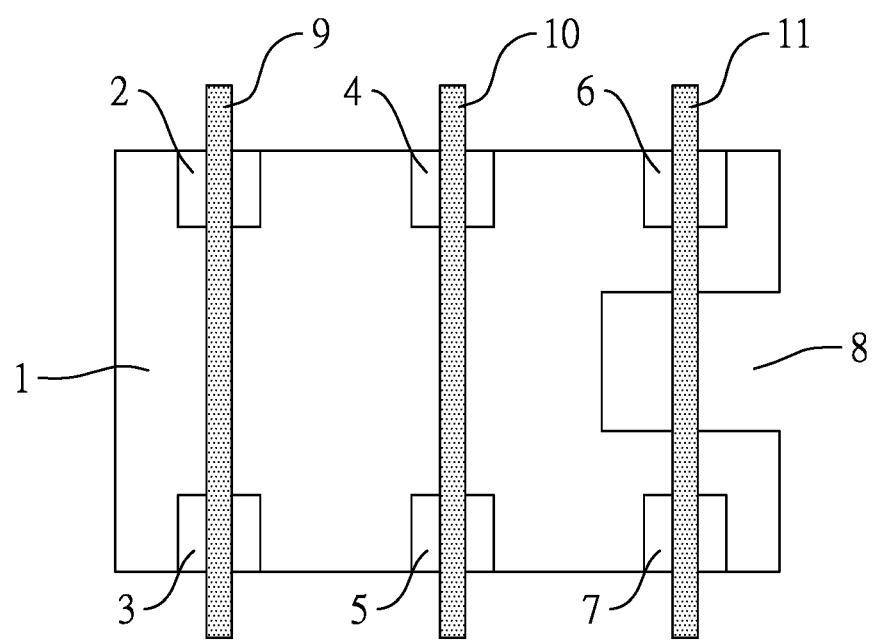
FIG. 3 is a perspective view of the other surface of the embodiment of the present invention after surface mounting on the three conductive wires.

With reference to FIG. 3, a common procedure of putting the surface mounted LED device into the LED string light is to surface mount the surface mounted LED device in series on three conductive lines, wherein one conductive line is connected to an anode power source as a power line 9, another conductive line is connected to a ground as a ground line 10, and the other conductive line is connected to a signal source as a signal line 11. A + symbol in FIG. 2 stands for anode power source connection and a − symbol in FIG. 2 stands for ground connection. As denoted, the power line 9 is electrically connected to the first power conductive pad 2 and the second power conductive pad 3, the ground line 10 is electrically connected to the first grounding conductive pad 4 and the second grounding conductive pad 5, and the signal line 11 is electrically connected to the signal input conductive pad 6 and the signal output conductive pad 7. Since the signal line 11 commonly transports the shift registered signal, having the signal input conductive pad 6 and the signal output conductive pad 7 of the surface mounted LED device simultaneously connecting the signal line 11 would cause a failure in transporting the shift registered signal.

The shift registered signal has to be transported by entering the driving chip 21 from the signal input port through the signal input conductive pad 6, and by exiting the driving chip 21 from the signal output port through the signal output conductive pad 7. In the LED string light, the surface mounted LED device must maintain connections in series instead of in parallel for the shift registered signal to enter and exit the driving chip 21 respectively, transporting color demands for the at least one color LED chip 21 respectively.

After the surface mounted LED device is surface mounted on the three conductive lines, the signal line 11 must be severed into segments during the manufacturing process to ensure an electrical disconnection between the signal input conductive pad 6 and the signal output conductive pad 7 of the same surface mounted LED device. The gap 8 provides the perfect space for the cutting apparatus to reach through and sever the signal line 11.

Figure 4:
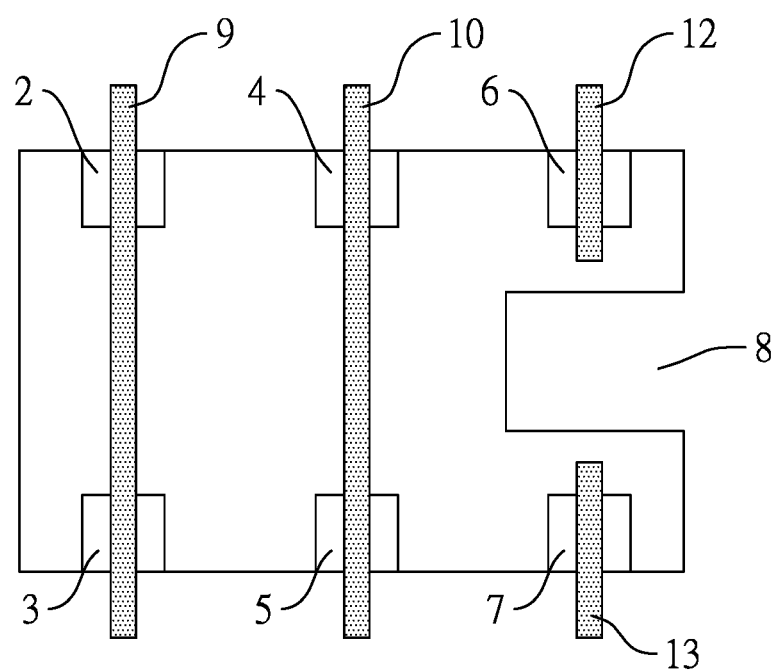
FIG. 4 is a perspective view of the other surface of the embodiment of the present invention after severing an electric connection through a gap.

With reference to FIG. 4, once severed, the signal line 11 would turn into a first signal line segment 12 and a second signal line segment 13, wherein the first signal line segment 12 is electrically connected to the signal input conductive pad 6 and the second signal line segment 13 is electrically connected to the signal output conductive pad 7. Therefore, the surface mounted LED device would be connected in series in the LED string light, ensuring the shift registered signal is transported nominally.

The cutting apparatus used for severing the signal line 11 through the gap 8 in the embodiment of the present invention is from an automatic assembly machine. The automatic assembly machines manufactures the LED string light by stamping using a surface mounted technology (SMT).

In the embodiment of the present invention, the gap 8 is rectangular shaped instead of circular shaped because most cutting apparatus would sever the signal line 11 by moving a blade in a straight line. A rectangle would provide the space for moving in a straight line better. However, if a process of making the gap 8 is by drilling through the PCB 1, then the gap 8 would be circular shaped instead, and as long as the space is big enough in the gap 8, the signal line 11 can still be severed into the first signal line segment 12 and the second signal line segment 13.

In the embodiment of the present invention, the gap 8 is located on the edge of the PCB 1 for an easier access from the cutting apparatus to reach and cut out the gap 8 from the PCB 1 and reach into the gap for the signal line 11. If the cutting apparatus used is from stamping, then the location of the gap 8 hardly makes a difference, but if the cutting apparatus used is from a sawing blade, then the gap 8 located on the edge of the PCB 1 would make the signal line 11 much easier to reach without accidentally cutting other parts of the PCB 1.

In the embodiment of the present invention, by having the second power conductive pad 3 mounted on the PCB 1 aligning with the first power conductive pad 2, the second grounding conductive pad 5 mounted on the PCB 1 aligning with the first grounding conductive pad 4, and the signal output conductive pad 7 mounted on the PCB 1 aligning with the signal input conductive pad 6, the PCB 1 is structured in a way so the power line 9, the ground line 10, and the signal line 11 are all aligned in straight lines. This way the cutting apparatus would have an easier time severing the signal line 11 without damaging the power line 9 and the ground line 10.

Furthermore, on a surface of the PCB 1 there are four sides, assuming the PCB 1 is rectangular shaped. By having the first power conductive pad 2, the first grounding conductive pad 4, and the signal input conductive pad 6 all located on a same side on the surface of the PCB 1, and the second power conductive pad 3, the second grounding conductive pad 5, and the signal output conductive pad 7 all located on another side on the surface of the PCB 1 as demonstrated in FIGS. 2, 3, and 4, then the power line 9, the ground line 10, and the signal line 11 would not only be aligned in straight lines but also parallel to each other. This way the cutting apparatus would have an easier time severing the signal line 11 without damaging the power line 9 and the ground line 10.

The embodiment of the present invention described above serves as a better demonstration and detailed explanation for the present invention rather than a limitation for what is claimed or what an embodiment should be. Any equivalent alteration with similar utility intents would be recognized as a violation of what is claimed for the present invention.

What is claimed is:

1. A surface mounted Light Emitting Diode (LED) device, comprising:
    a printed circuit board (PCB);
    at least one color LED chip, mounted on the PCB;
    a driving chip, mounted on the PCB, and electrically connected to the at least one color LED chip to drive the at least one color LED chip; wherein the driving chip comprises a power port, a grounding port, a signal input port, and a signal output port;
    a first power conductive pad, mounted on a surface of the PCB, and electrically connected to the power port of the driving chip;
    a first grounding conductive pad, mounted on the surface of the PCB, and electrically connected to the grounding port of the driving chip;
    a signal input conductive pad, mounted on the surface of the PCB, and electrically connected to the signal input port of the driving chip; and
    a signal output conductive pad, mounted on the surface of the PCB, and electrically connected to the signal output port of the driving chip,
    wherein the PCB comprises a gap formed on the PCB and through the PCB, and the gap of the PCB is located between the signal input conductive pad and the signal output conductive pad, and
    wherein the gap allows a cutting tool to enter and to sever therein an electrical connection connecting the signal input conductive pad and the signal output conductive pad.

2. The surface mounted LED device as claimed in claim 1, wherein the gap, the signal input conductive pad, and the signal output conductive pad are aligned.

3. The surface mounted LED device as claimed in claim 1, further comprising:
    a second power conductive pad, mounted on the surface of the PCB, aligning with the first power conductive pad, and electrically connected to the power port of the driving chip;
    a second grounding conductive pad, mounted on the surface of the PCB, aligning with the first grounding conductive pad, and electrically connected to the grounding port of the driving chip.

4. The surface mounted LED device as claimed in claim 3, wherein the second power conductive pad, the second grounding conductive pad, and the signal output conductive pad are all located on a same side of the surface of the PCB.

5. The surface mounted LED device as claimed in claim 1, wherein the first power conductive pad, the first grounding conductive pad, and the signal input conductive pad are all located on a same side of the surface of the PCB.

6. The surface mounted LED device as claimed in claim 3, wherein the first power conductive pad, the first grounding conductive pad, and the signal input conductive pad are all located on a same side on one side of the surface of the PCB.

7. The surface mounted LED device as claimed in claim 6, wherein the second power conductive pad, the second grounding conductive pad, and the signal output conductive pad are all located on another side of the surface of the PCB.

8. The surface mounted LED device as claimed in claim 1, wherein the gap is formed on an edge of the PCB.

9. The surface mounted LED device as claimed in claim 1, wherein the gap is rectangular shaped.

\* \* \* \* \*